(12) United States Patent
Liao

(10) Patent No.: US 7,726,978 B2
(45) Date of Patent: Jun. 1, 2010

(54) ELECTRICAL CONNECTOR WITH FASTENING MECHANISM

(75) Inventor: Chi-Nan Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/381,421

(22) Filed: Mar. 10, 2009

(65) Prior Publication Data
US 2009/0227135 A1    Sep. 10, 2009

(30) Foreign Application Priority Data
Mar. 10, 2008    (TW) .............................. 97204005 U

(51) Int. Cl.
*H01R 12/00* (2006.01)
(52) U.S. Cl. ........................................ 439/73; 439/331
(58) Field of Classification Search .................. 439/73, 439/331
See application file for complete search history.

(56) References Cited

U.S. PATENT DOCUMENTS

2008/0045048 A1*    2/2008    Ma .............................. 439/73

\* cited by examiner

*Primary Examiner*—Ross N Gushi
(74) *Attorney, Agent, or Firm*—Andrew C. Cheng; Wei Te Chung; Ming Chieh Chang

(57) ABSTRACT

An electrical connector for use with an electronic package, includes an insulative housing with a number of contacts receiving in the insulative housing and a fastening mechanism assembled to the insulative housing adapt to secure the electronic package to the electrical connector. The fastening mechanism includes a cover with a base plate and a pair of sidewalls extending downwardly from the base plate. The cover has an opening in the center of the base plate and a number of pressing portions extending into the opening for pressing the electronic package contact with the contacts.

18 Claims, 4 Drawing Sheets

US 7,726,978 B2

ELECTRICAL CONNECTOR WITH FASTENING MECHANISM

BACKGROUND OF THE INVENTION

1. Field of the Invention

The present invention relates to an electrical connector, and more particularly to an electrical connector with robust stiffener in which a newly designed cover is provided so as to ensure efficient heat dissipation for a central process unit (CPU) mounted thereon during servicing.

2. Description of the Prior Art

FIG. 1 and FIG. 2 show an electrical connector comprising an insulative housing (not shown). The insulative housing has a top surface for receiving an electronic package 2'. A metallic reinforcing plate 3' is surrounding the insulative housing. A cover 4' is pivotally mounted on a first end of the stiffener 3'. The cover 4' can be pivotally rotated between a closed position in which the CPU package is pressed to in close contact with the contacts of the socket, and an opened position in which the CPU socket can be removed therefrom. A lever 5' is pivotally mounted on a second end of the metallic reinforcing plate 3'. The lever 5' has a locking portion 51' for locking the cover 4' in the closed position.

The cover 4' of the above-described electrical connector is detailedly described as follows. The cover 4' has a rectangular shape and formed by stamping and bending from a metal sheet. The cover 4' has an opening at a center thereof and with a front end and a rear end. Between the front end and rear end, the cover 4' is bent downward to form a pair of sidewalls for pressing the electronic package 2' assembled within the electrical connector.

In general, a top surface of the cover 4' is lower than a top surface of the electronic package 2' such that a heatsink can be closely in contact with an upper surface of the CPU to keep a robust heat dissipation. However, bending down of the sidewalls to form pressing portions 45' will cause opposite ends of the sidewalls project upwardly thereby creating an uneven surface. Thus, the cover 4' will prevent the heat sink device (not shown) from in close contact with the top surface L' of the electronic package 2' and result in a poor heat dissipating for the heat sink device. Therefore, the cover must be well controlled so that the opposite ends of the sidewalls are lower than the top surface L' of the electronic package 2'.

SUMMARY OF THE INVENTION

Accordingly, an object of the present invention is to provide an electrical connector with a fastening mechanism configured by a cover with an even and flatten upper surface for pressing an electronic package providing a robust heat dissipating for the electronic package mounted thereon.

In order to achieve the object set forth, a fastening mechanism used with an electrical connector comprises a stiffener having a window in the center thereof, a cover pivotally mounted to one end of the stiffener and a lever pivotally mounted to the other end of the stiffener and locking the cover at a closed position. The cover comprises a base plate and a pair of sidewalls extending downwardly from the base. The cover has an opening corresponding to the window of the stiffener and has a plurality of pressing portions extending upwardly from the base plate and projecting laterally into the opening.

In order to further achieve the object set forth, an electrical connector for use with an electronic package, comprises an insulative housing with a plurality of contacts receiving in the insulative housing and a fastening mechanism surrounding the insulative housing adapt to secure the electronic package to the electrical connector. The fastening mechanism includes a cover comprising a flat base plate and a pair of sidewalls extending downwardly from the base plate. The cover has an opening in the center of the base plate. A plurality of pressing portions extend into the opening for pressing the electronic package contacting with the contacts. The pressing portions are higher than the base and lower than a top surface of the electronic package.

DESCRIPTION OF PREFERRED EMBODIMENT

Reference will now be made to the drawings to describe the present invention in detail.

Figure 1:
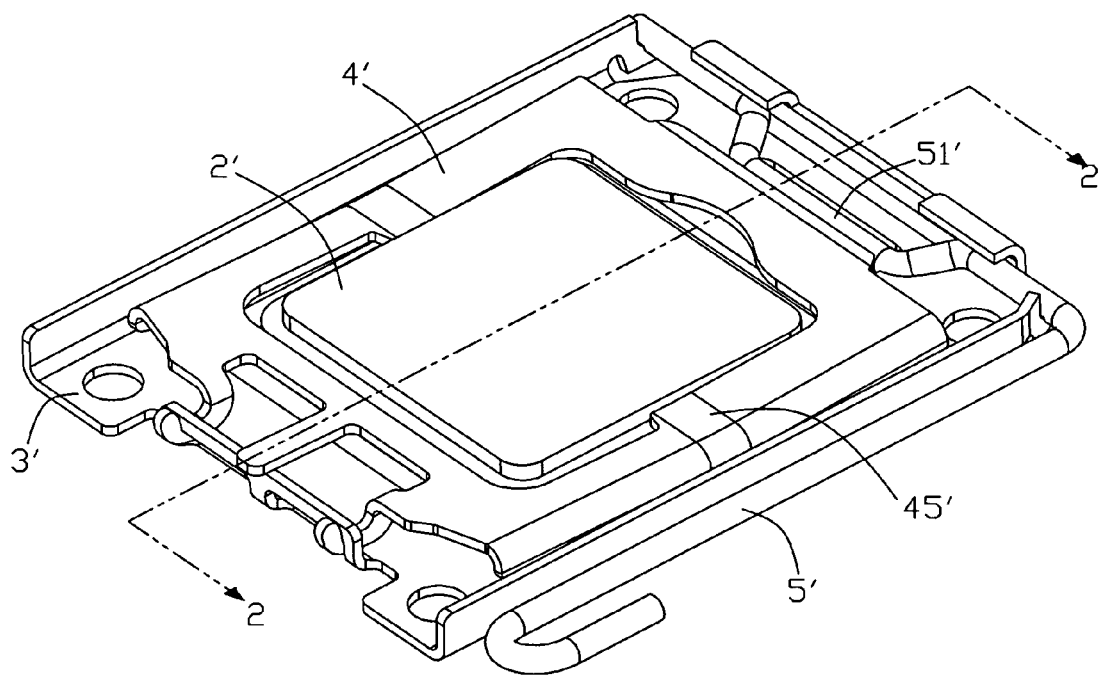
FIG. 1 is an assembled perspective view of a conventional electrical connector.
Figure 2:
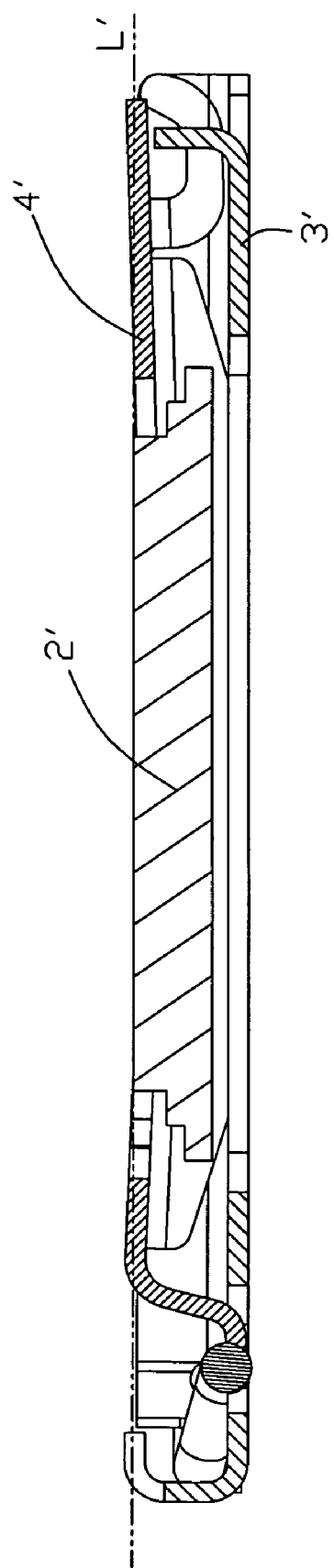
FIG. 2 is a cross-sectional view taken along line 2-2 of the FIG. 1.
Figure 3:
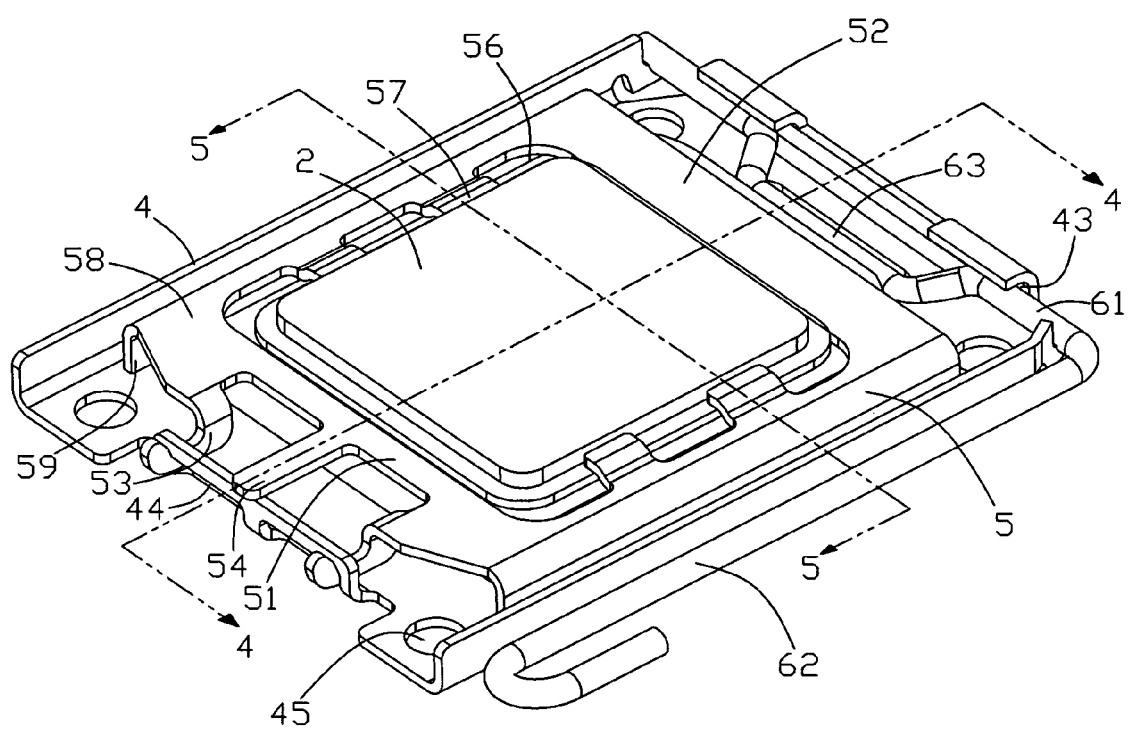
FIG. 3 is an assembled view of an electrical connector of the present invention.

Referring to FIG. 3, an electrical connector of the present invention used to connect an electronic package 2 with a printed circuit board (not shown) comprises an insulative housing 7, a plurality of contacts 8 received in the insulative housing 7 and a fastening mechanism adapted to press the electronic package 2 toward the insulative housing 7.

The insulative housing 7 has a rectangular shape and is molded from resin or the like. The contacts 8 received in the insulative housing 7 contact with the electronic package 2 at a top portion and each has a solder ball (not labeled) at a bottom portion.

The fastening mechanism includes a stiffener 4 surrounds the insulative housing 7, a cover 5 pivotally mounted on one end of the stiffener 4, and a lever 6 pivotally assembled to the other end of the stiffener 4. The fastening mechanism is adapted to secure the electronic package 2 contacting with the contacts 8 so as to establish an electrical connection therebetween.

The stiffener 4 is made of a metal sheet and includes a planar base 42 and a window (not labeled) in a center adapted to enclose the insulative housing 7 therein. One end of the stiffener 4 projects upward and bends inward to form a bearing portion 43 to supporting the lever 6, and the other end of the stiffener 4 forms a retaining portion 44 for receiving the cover 5. A number of holes 45 are provided at the corner of the base 42 to secure the electrical connector on the printed circuit board.

Figure 4:
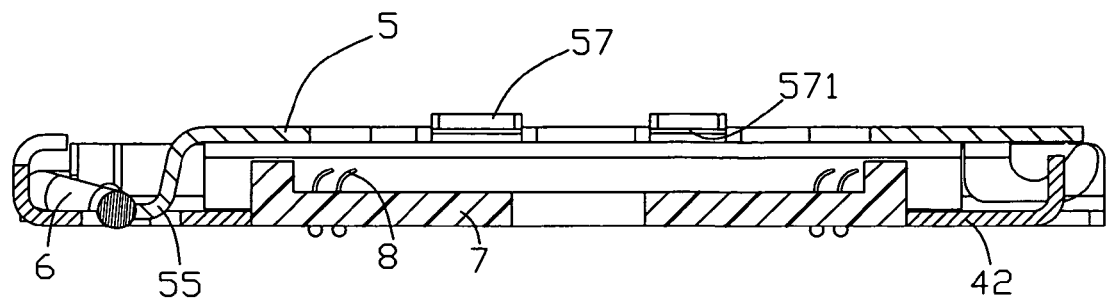
FIG. 4 is a cross-sectional view taken along line 4-4 of the FIG. 3, wherein an electronic package is not shown.

The cover 5 has a rectangular shape and is formed by stamping and bending from a metal sheet. The cover 5 comprises a flat base plate 58 with an opening 56 in the center and a pair of sidewalls 59 extending downwardly from opposite sides of the base plate 58. The cover 5 has a first end 51 for pivotally mounted to the stiffener 4 and a second end 52 for pivotally mounted to the lever 6. A pair of bearing tongues 53 are projected from the first end 51 of the cover 5 and are accommodated in the retaining portions 44. A holding element 54 is formed between the bearing tongues 53. A locking portion 55 is formed in the second end 52 and extends forward to engage with the lever 6. Referring to FIG. 4, the cover 5 has a plurality of pressing portions 57 extending from the inner side edges of the base plate 58 and toward the opening 56. The pressing portions 57 are extending upwardly from the base plate 58 and projecting into the opening 56 to press the electronic package 2. The pressing portion 57 has a contact portion 571 at a bottom thereof to contact with the electronic package 2.

The lever 6 is bent from a metal bar and configured an L-shape. The lever 6 comprises a retaining axis 61 and an actuating axis 62 perpendicular to the retaining axis 61. A projecting portion 63 is projecting from the retaining axis 61 for pressing the locking portion 55 of the cover 5.

Figure 5:
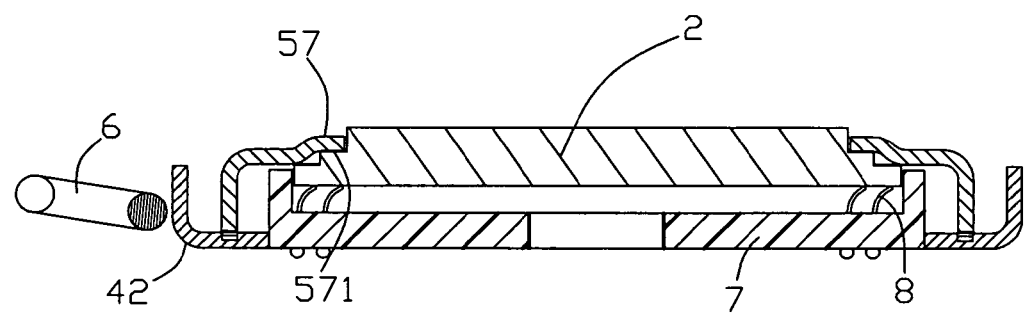
FIG. 5 is a cross-sectional view taken along line 5-5 of the FIG. 3.

As shown in FIG. 5, in the present invention, the pressing portions 57 are higher than the base plate 58 and substantially parallel to the base plate 58. When the electronic package 2 is disposed within the electrical connector, the contacting portions 571 press onto the electronic package 2. Since the pressing portions 57 are projecting upwardly from the base plate 58 and contact with the package 2 with a horizontal surface, it will not cause a deflection of the cover 5. Therefore, the uppermost surface of the cover 5 is located under the top face of the package 2 and the heat sink device (not shown) will be ensured to have a complete and thorough contact the electronic package 2 with well heat dissipation.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A fastening mechanism used with an electrical connector comprising:
    a stiffener having a window in the center thereof;
    a cover pivotally mounted to one end the stiffener and comprising a base plate and a pair of sidewalls extending downwardly from the base, the cover having an opening corresponding to the window of the stiffener and having a plurality of pressing portions extending upwardly from the base plate and projecting into the opening; and
    a lever pivotally mounted to the other end of the stiffener and locking the cover at a closed position.

2. The fastening mechanism as claimed in claim 1, wherein each pressing portion has contact portion at bottom surface thereof, and wherein the contact portion is higher than a bottom surface of base plate.

3. The fastening mechanism as claimed in claim 1, wherein the pressing portions are positioned between the first and second end of the cover and at opposite edges of the base plate.

4. The fastening mechanism as claimed in claim 1, wherein the pressing portions are parallel to the base plate.

5. The fastening mechanism as claimed in claim 1, wherein the lever comprises a retaining axis and an actuating axis perpendicular to the retaining axis, the actuating axis forms an offset projecting portion for locking the cover.

6. An electrical connector for use with an electronic package, comprising:
    an insulative housing and a plurality of contacts received in the insulative housing;
    a fastening mechanism surrounding the insulative housing and adapted to secure the electronic package to the insulative housing, the fastening mechanism including a cover comprising a flat base plate and a pair of sidewalls extending downwardly from the base plate, the cover having an opening in the center of the base plate and a plurality of pressing portions extending into the opening for pressing the electronic package to contact with the contacts, the pressing portion being positioned higher than the base plate and lower than a top surface of the electronic package.

7. The electrical connector as claimed in claim 6, wherein the pressing portions are adjacent to the opening.

8. The electrical connector as claimed in claim 6, wherein the fastening mechanism further includes a stiffener and a lever mounted to one end of the stiffener, and wherein the cover is pivotally mounted to the other end of the stiffener.

9. The electrical connector as claimed in claim 8, wherein the lever comprises a retaining axis and an actuating axis perpendicular to the retaining axis, the actuating axis forms an offset projecting portion for locking the cover.

10. The electrical connector as claimed in claim 6, wherein the pressing portions has contact portion at bottom surface thereof.

11. The electrical connector as claimed in claim 10, wherein the pressing portion is parallel to the base plate and the contact portion is higher than a bottom surface of the base plate.

12. The electrical connector as claimed in claim 6, wherein a number of holes are provided at the corner of the stiffener to secure the electrical connector.

13. The electrical connector as claimed in claim 6, wherein a top surface of the electronic package is higher than the press portions.

14. An electrical connector for use with an IC package, comprising:
    a metallic stiffener defining opposite first and second ends thereof in a front-to-back direction;
    an insulative housing located between said first and second ends;
    a plurality of contacts disposed in the housing;
    a metallic lever pivotally mounted upon the first end;
    a metallic cover pivotally mounted upon the second end and defining a locking portion at a free end thereof to be engaged by the lever;
    said cover defining a central opening surrounded by inner side edges of said cover, with at least a pair of pressing portions extending from two opposite side edges of said cover toward the center opening in a cantilevered manner for downwardly pressing against the IC package
    wherein said cover defines a base plate forming said side edges thereof, and said pressing portion extends upwardly above said base plate.

15. The electrical connector as claimed in claim 14, wherein said pressing portion extend along a transverse direction perpendicular to said front-to-back direction.

16. The electrical connector as claimed in claim 14, wherein a plurality of side walls downwardly from corresponding outer side edges of the base plate.

17. The electrical connector as claimed in claim 16, wherein said stiffener defines a plurality of side walls protectively located outside of the side walls of the cover.

18. The electrical connector as claimed in claim 14, wherein said pressing portions are offset upwardly from the base plate.

* * * * *